US012696781B2

(12) United States Patent
    Kwak

(10) Patent No.: US 12,696,781 B2
(45) Date of Patent: Jul. 28, 2026

(54) INTEGRATED PACKAGE AND METHOD FOR MAKING THE SAME

(71) Applicant: STATS ChipPAC Pte. Ltd., Singapore (SG)

(72) Inventor: ByungHyun Kwak, Incheon (KR)

( * ) Notice: Subject to any disclaimer, the term of this patent is extended or adjusted under 35 U.S.C. 154(b) by 367 days.

(21) Appl. No.: 18/460,623

(22) Filed: Sep. 4, 2023

(65) Prior Publication Data

US 2024/0105569 A1     Mar. 28, 2024

(30) Foreign Application Priority Data

Sep. 28, 2022     (CN) .......................... 202211193207.6

(51) Int. Cl.
    *H10W 70/685*        (2026.01)
    *H10P 74/20*          (2026.01)
                (Continued)

(52) U.S. Cl.
    CPC ......... *H10W 70/685* (2026.01); *H10P 74/203* (2026.01); *H10W 46/00* (2026.01);
                (Continued)

(58) Field of Classification Search
    CPC ........... H01L 23/49822; H01L 21/4853; H01L 22/12; H01L 23/3128; H01L 23/49816; H01L 23/544; H01L 25/105; H01L 24/16; H01L 24/48; H01L 2223/54426; H01L 2223/54486; H01L 2225/1058; H01L 21/60; H01L 2021/60022; H01L 21/68; H01L 25/0657; H10W 70/685;
                (Continued)

(56) References Cited

U.S. PATENT DOCUMENTS

| 7,989,707 B2 | 8/2011 | Yamano et al. |
| 8,076,765 B2 | 12/2011 | Chen et al. |

(Continued)

FOREIGN PATENT DOCUMENTS

| TW | 200414495 A | 8/2004 |
| TW | 200836272 A | 9/2008 |

(Continued)

*Primary Examiner* — Julia Slutsker
(74) *Attorney, Agent, or Firm* — .Junhe Law Office, P.C.; Yi Zhang

(57)            ABSTRACT

An integrated package and a method for making the same are provided. The integrated package includes: a first substrate including: a first interconnection area having a plurality of first interconnection structures; and a first alignment structure disposed outside the first interconnection area; a second substrate stacked above the first substrate and including: a second interconnection area having a plurality of second interconnection structures; and a second alignment structure disposed outside the second interconnection area, wherein the second alignment structure is substantially aligned with the first alignment structure in a stacking direction of the first substrate and the second substrate; and a connecting element disposed between the first substrate and the second substrate and configured for electrically connecting at least one of the plurality of first interconnection structures with at least one of the plurality of second interconnection structures.

13 Claims, 8 Drawing Sheets

(51) Int. Cl.

| | |
|---|---|
| *H10W 46/00* | (2026.01) |
| *H10W 70/05* | (2026.01) |
| *H10W 74/10* | (2026.01) |
| *H10W 90/00* | (2026.01) |

(52) U.S. Cl.

CPC ........ *H10W 70/093* (2026.01); *H10W 74/117* (2026.01); *H10W 90/00* (2026.01); *H10W 90/701* (2026.01); *H10W 46/301* (2026.01); *H10W 90/724* (2026.01); *H10W 90/754* (2026.01)

(58) Field of Classification Search

CPC . H10W 46/00; H10W 70/093; H10W 74/117; H10W 90/00; H10W 90/701; H10W 46/301; H10W 90/724; H10W 90/754; H10W 46/607; H10W 70/60; H10W 72/20; H10W 70/611; H10W 90/401; H10W 90/722; H10W 72/071; H10W 74/012; H10W 74/15; H10W 95/00; H10W 72/072; H10W 70/65; H10P 74/203; H10P 74/27; H10P 72/50

See application file for complete search history.

(56) References Cited

U.S. PATENT DOCUMENTS

| | | | |
|---|---|---|---|
| 9,859,200 B2 | 1/2018 | Park et al. | |
| 2010/0007002 A1* | 1/2010 | Pendse .................. | H01L 25/105 257/692 |
| 2010/0326714 A1 | 12/2010 | Fukuzono | |
| 2011/0088936 A1 | 4/2011 | Schaaf et al. | |
| 2016/0174387 A1* | 6/2016 | Tuominen .............. | H01L 24/19 29/17.3 |
| 2020/0013764 A1* | 1/2020 | Kim ...................... | H01L 25/105 |
| 2020/0043854 A1* | 2/2020 | Oh ........................ | H01L 25/105 |

FOREIGN PATENT DOCUMENTS

| | | |
|---|---|---|
| TW | 201123364 A | 7/2011 |
| TW | 201130109 A | 9/2011 |
| TW | 201618196 A | 5/2016 |
| TW | 201822284 A | 6/2018 |

* cited by examiner

600

610 providing a first substrate

620 forming a connecting element

630 providing a second substrate

640 mounting the second substrate over the first substrate

650 inspecting the first alignment structure and the second alignment structure

Second alignment structure

First alignment structure

INTEGRATED PACKAGE AND METHOD FOR MAKING THE SAME

TECHNICAL FIELD

The present application generally relates to semiconductor technology, and more particularly, to an integrated package and a method for making the same.

BACKGROUND OF THE INVENTION

Multi-stacked package is a type of packaging method that combines two or more integrated circuit (IC) packages together. In a typical Package-on-Package (PoP), two or more packages are vertically connected (i.e., stacked) via an interface that can direct signals between them. A PoP assembly can more efficiently use space, and reduces lengths of signal tracks between the packages. Thus, a better electrical performance can be achieved, as the shorter track length may reduce noises and cross talks in integrated circuits and promote faster signal response. However, it is hard to detect alignment between a lower package and an upper package in the PoP assembly, resulting in low reliability.

Therefore, a need exists for integrated packages with improved reliability.

SUMMARY OF THE INVENTION

An objective of the present application is to provide an integrated package with high reliability.

According to an aspect of the present application, an integrated package is provided. The integrated package may include: a first substrate including: a first interconnection area having a plurality of first interconnection structures; and a first alignment structure disposed outside the first interconnection area; a second substrate stacked above the first substrate and including: a second interconnection area having a plurality of second interconnection structures; and a second alignment structure disposed outside the second interconnection area, wherein the second alignment structure is substantially aligned with the first alignment structure in a stacking direction of the first substrate and the second substrate; and a connecting element disposed between the first substrate and the second substrate and configured for electrically connecting at least one of the plurality of first interconnection structures with at least one of the plurality of second interconnection structures.

According to another aspect of the present application, a method for making an integrated package is provided. The method may include: providing a first substrate, wherein the first substrate includes a first interconnection area having a plurality of first interconnection structures, and a first alignment structure disposed outside the first interconnection area; forming a connecting element on the first substrate, wherein the connecting element is electrically connected with at least one of the plurality of first interconnection structures; providing a second substrate, wherein the second substrate includes a second interconnection area having a plurality of second interconnection structures, and a second alignment structure disposed outside the second interconnection area; mounting the second substrate over the first substrate with the connecting element, wherein the connecting element is electrically connected with at least one of the plurality of second interconnection structures; and inspecting the first alignment structure and the second alignment structure to determine whether the second substrate is aligned with the first substrate.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
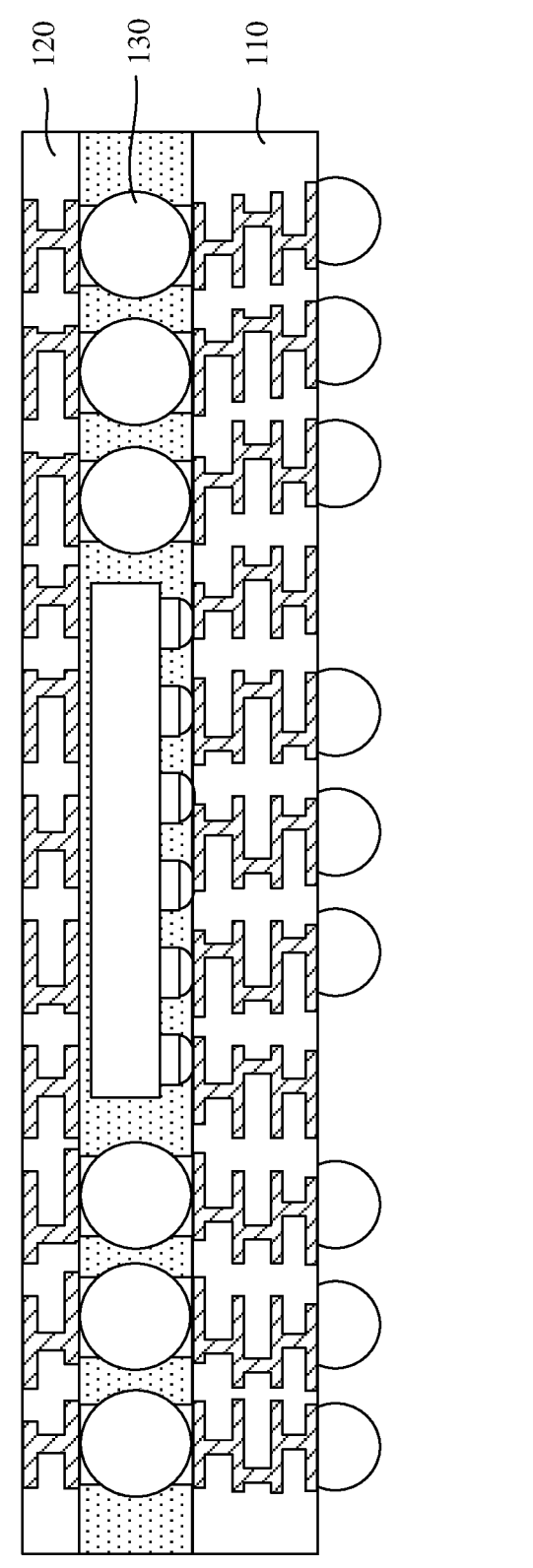
FIG. 1 is a cross-sectional view of an integrated package.

FIG. 1 illustrates a cross-sectional view of an integrated package 100, which includes a substrate 110 and an interposer 120. The interposer 120 is mounted over the substrate 110 with connecting elements 130. Generally, contact pads within the interposer 120 should be accurately aligned with respective contact pads within the substrate 110 to obtain a good joint quality with the connecting elements 130, and an X-ray inspection tool is usually employed to inspect the alignment between the interposer 120 and the substrate 110 as X-ray can directly penetrate into the package.

However, the integrated package 100 may include large solder balls, large metal pads and various metal patterns that overlap with each other. In addition, it may be difficult to distinguish among the contact pads of the substrate 110, the contact pads of the interposer 120 and the connecting elements 130. Thus, a misalignment between a contact pad of the interposer 120 and a respective contact pad of the substrate 110 can not be found because of the confusion among the solder balls, the metal pads, and the metal patterns in the X-ray image. For example, there may be an offset between the contact pad of the substrate 110 and the connecting element 130, and/or another offset between the contact pad of the interposer 120 and the connecting element 130. These misalignments may cause solder joint failures, resulting in a probing fail in the final test (FT).

To address at least one of the above problems, an integrated package is provided in an aspect of the present application. The integrated package includes a first substrate and a second substrate stacked above the first substrate. A first alignment structure is formed outside an interconnection area of the first substrate, a second alignment structure is formed outside an interconnection area of the second substrate, and the second alignment structure is substantially aligned with the first alignment structure in a stacking direction of the first substrate and the second substrate. A connecting element is used to connect an interconnection structure in the interconnection area of the first substrate and another interconnection structure in the interconnection area of the second substrate. When an X-ray inspection tool is used to inspect the integrated package, the first and second alignment structures may not overlap with the contact pads and the connecting element and can be easily recognized in a top view, because they are formed outside the interconnection areas of the first and second substrates respectively. Thus, it can be easily determined whether the first and second alignment structures are aligned with each other, or whether the first and second substrate are aligned with each other.

Figure 2A:
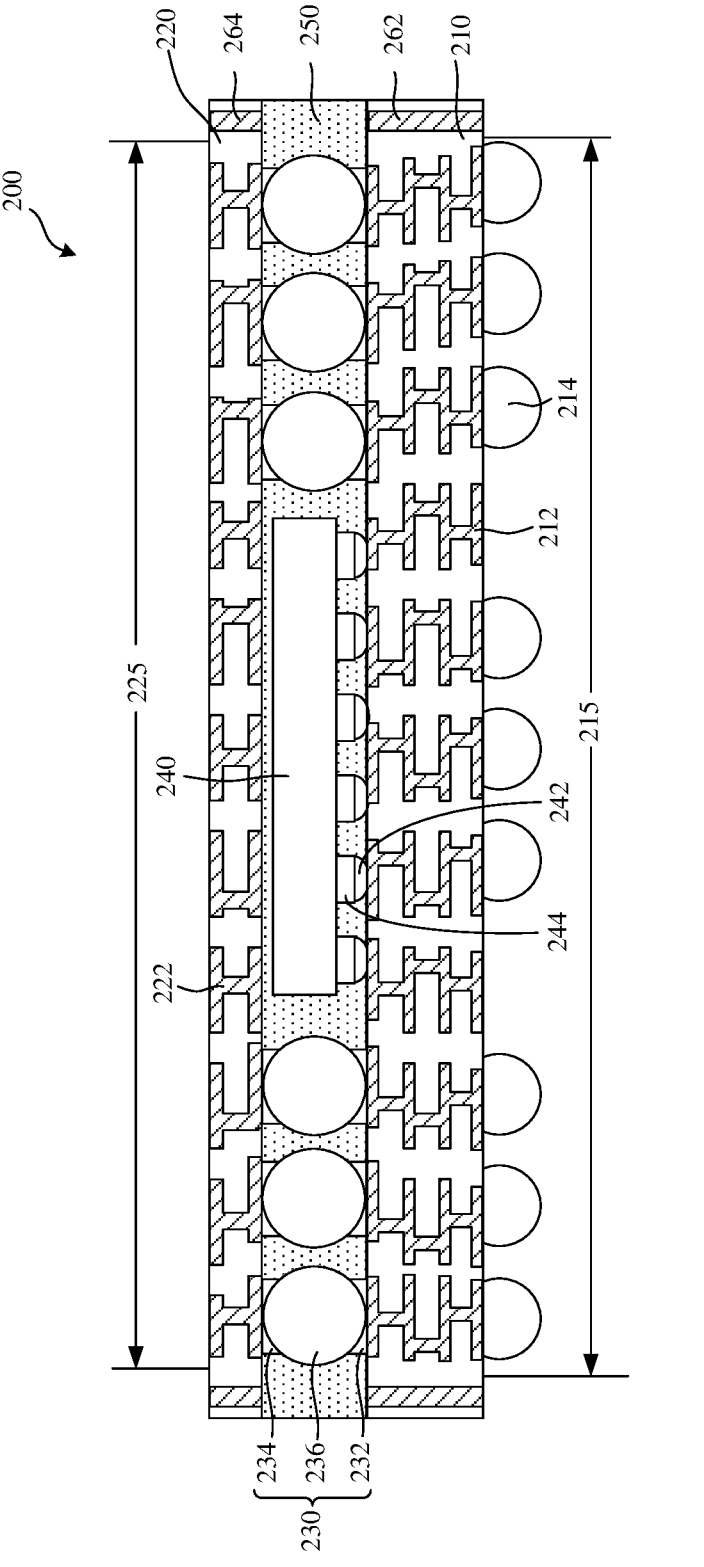
FIG. 2A is a cross-sectional view of an integrated package according to an embodiment of the present application.
Figure 2B:
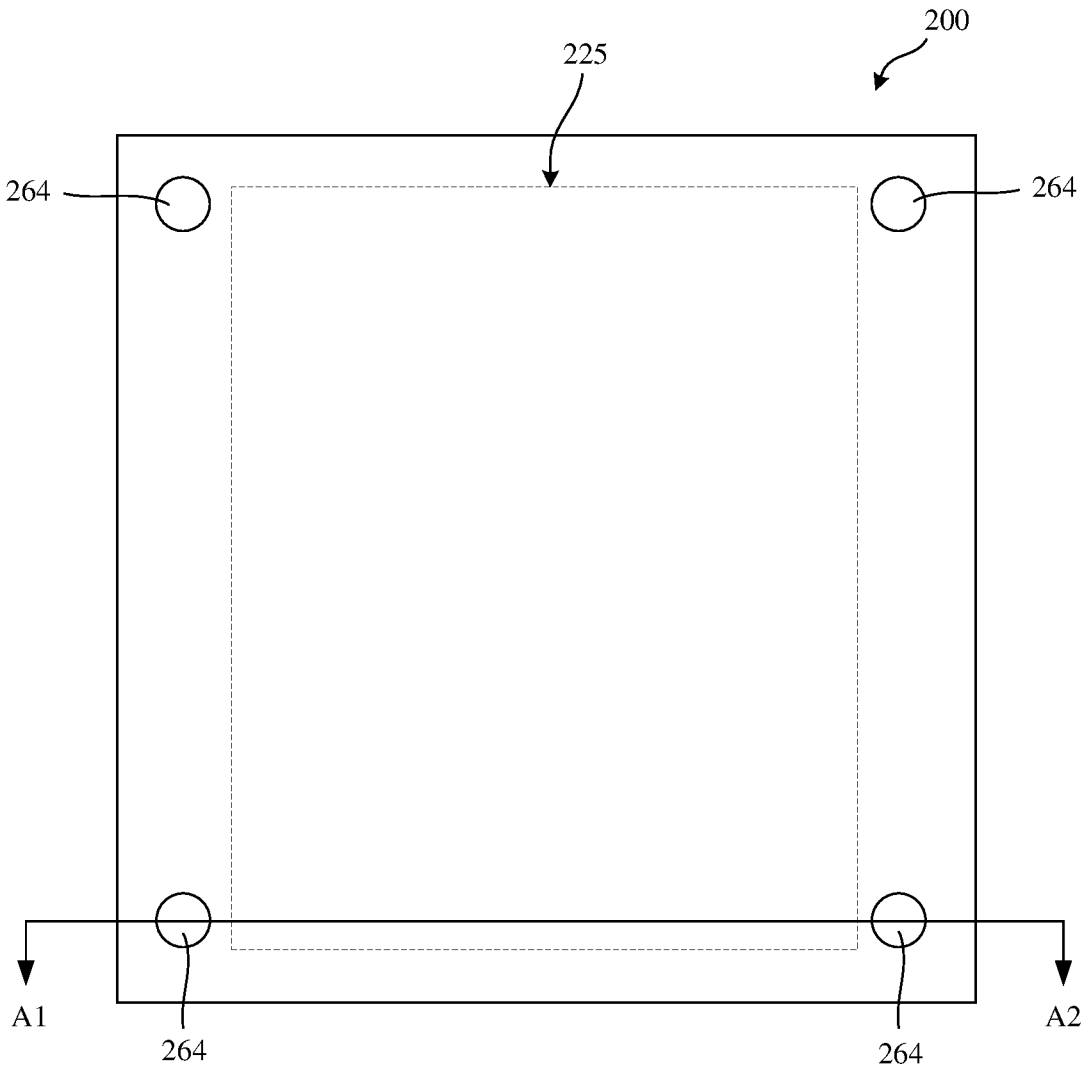
FIG. 2B is a top view of the integrated package of FIG. 2A.

Referring now to FIG. 2A and FIG. 2B, an integrated package 200 is illustrated according to an embodiment of the present application. FIG. 2B is a top view of the integrated package 200, and FIG. 2A is a cross-sectional view of the integrated package 200 along a section line A1-A2 shown in FIG. 2B. The integrated package 200 may include a first substrate 210, a second substrate 220 stacked above the first substrate 210, and a plurality of connecting elements 230 disposed between the first substrate 210 and the second substrate 220.

The first substrate 210 can provide support and connectivity for electrical components and devices. By way of example, the first substrate 210 can include a printed circuit board (PCB), a carrier substrate, a semiconductor substrate with electrical interconnections, or a ceramic substrate. However, the first substrate 210 is not to be limited to these examples. In other examples, the first substrate 210 may include a laminate interposer, a strip interposer, a leadframe, or other suitable substrates. The first substrate 210 may include any structure on or in which an integrated circuit system can be fabricated. For example, the first substrate 210 may include one or more insulating or passivation layers, one or more conductive vias formed through the insulating layers, and one or more conductive layers formed over or between the insulating layers.

Referring to FIGS. 2A and 2B, the first substrate 210 may include a first interconnection area 215, and a plurality of first interconnection structures 212 may be formed in the first interconnection area 215. The first interconnection structures 212 can provide connectivity for electrical components mounted on the first substrate 210. The first interconnection structures 212 may include one or more of Al, Cu, Sn, Ni, Au, Ag, or any other suitable electrically conductive materials. In some examples, the first interconnection structures 212 may include redistribution structures (RDS). The RDS may include one or more dielectric layers and one or more conductive layers between and through the dielectric layers. The conductive layers may define pads, traces and plugs through which electrical signals or voltages can be distributed horizontally and vertically across the RDS.

The first interconnection structures 212 can provide contact pads along the top surface of the first substrate 210 for mounting devices, chips, and interconnects. For example, as shown in FIG. 2A, a first electronic component 240 is mounted on the contact pads along the top surface of the first substrate 210. The first electronic component 240 may include any of a variety of types of semiconductor dice, semiconductor packages, or discrete devices. For example, the first electronic component 240 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The first electronic component 240 may also include one or more passive electrical components such as resistors, capacitors, inductors, etc.

In the example shown in FIG. 2A, the first electronic component 240 is a semiconductor die in a flip-chip configuration. The first electronic component 240 includes a chip interconnect 242 and a chip pillar 244, which are conductive structures for connecting the first electronic component 240 to the first substrate 210. The chip interconnect 242 may include solder balls or solder bumps. The chip pillar 244 may include studs or pillars to facilitate the mounting of the first electronic component 240 to the first interconnection structures 212 of the first substrate 210. However, the scope of this application is not limited to the example shown in FIG. 2A. The first electronic component 240 can include other configurations and can be mounted on the top surface of the first substrate 210 using any suitable surface mounting techniques.

A plurality of external interconnection structures 214 are formed on a bottom surface of the first substrate 210 and electrically connected with the first interconnection structures 212. The external interconnection structures 214 are used to interface with or attach the integrated package 200 to an external device, such as to an external substrate. The external interconnection structures 214 may include solder balls or solder bumps as examples, but the scope of this application is not limited thereto.

The integrated package 200 further includes the second substrate 220, which also can be referred to as an interposer. The second substrate 220 may include a second interconnection area 225, and a plurality of second interconnection structures 222 may be formed in the second interconnection area 225. In the example shown in FIG. 2A, a size of the second interconnection area 225 is substantially the same as that of the first interconnection area 215. In other examples, the size of the second interconnection area 225 may be bigger or smaller than that of the first interconnection area 215. In some embodiments, the second substrate 220 may have a similar structure to the first substrate 210, except that the second substrate 220 is mounted above the first electronic component 240. It could be understood that the second substrate 220 may also have a different structure than the first substrate 210, as long as it can provide support and connectivity for components and devices in the integrated package 200.

The integrated package 200 further includes the connecting elements 230 disposed between the first substrate 210 and the second substrate 220. Each connecting element 230 is configured for electrically connecting at least one of the first interconnection structures 212 with at least one of the second interconnection structures 222.

In the example shown in FIG. 2A, the connecting element 230 has a Cu-cored solder ball (CCSB) structure. Specifically, the connecting element 230 includes a bottom conductive joint 232, a top conductive joint 234 and a conductive ball 236. The bottom conductive joint 232 may be attached to the contact pad of the first substrate 210, and the top conductive joint 234 may be attached to the contact pad of the second substrate 220. The bottom conductive joint 232 and the top conductive joint 234 may include solder paste printing, micro-ball drop, or pre-mounted solder with fluxing. The conductive ball 236 is used to connect the bottom conductive joint 232 and the top conductive joint 234. The conductive ball 236 can provide structural support and electrical connectivity for the first substrate 210 and the second substrate 220, and can provide adhesion between the first substrate 210 and the second substrate 220. In some examples, the conductive ball 236 may include a core body and a coating layer outside the core body. The core body of the conductive ball 236 can include a metallic material, which can support the weight of the second substrate 220 and other components in the integrated package 200. For example, the core body of the conductive ball 236 may include copper or copper alloy. The coating layer may include an anti-oxide metallic material such as nickel (Ni), gold (Au), palladium (Pd), or a combination thereof, and/or an organic solderability preservative (OSP). However, the structure of the connecting element 230 is not limited to the example shown in FIG. 2A. In other embodiments, the connecting element 230 may be a solder ball or a solder bump.

The integrated package 200 further includes a first encapsulant 250 formed between the first substrate 210 and the second substrate 220. The first encapsulant 250 can be a molding compound that covers the first electronic component 240 and the connecting elements 230. The first encapsulant 250 can provide mechanical protection, environmental protection, and a hermetic seal for the integrated package 200. The first encapsulant 250 can be made from an epoxy molding compound (EMC), film assisted molding, or polymide compound, as examples.

Continuing referring to FIG. 2A and FIG. 2B, a first alignment structure 262 is formed in the first substrate 210 and outside the first interconnection area 215, and a second alignment structure 264 is formed in the second substrate 220 and outside the second interconnection area 225. The first alignment structure 262 and the second alignment structure 264 are provided to accurately identify or detect the alignment between the first substrate 210 and the second substrate 220 with an X-ray inspection tool, when or after the second substrate 220 is stacked or mounted above the first substrate 210.

In some embodiments, the first alignment structure 262 and the second alignment structure 264 may include a material the same as a material of the first interconnection structure 212 and the second interconnection structures 222 respectively. For example, the first alignment structure 262 and the second alignment structure 264 may be formed by a same manufacturing process as the first interconnection structure 212 and the second interconnection structures 222 respectively. However, the scope of this application is not limited thereto. In some other examples, the first alignment structure 262/second alignment structure 264 may have a different material than the first interconnection structure 212/second interconnection structures 222.

In the example shown in FIG. 2A, the first alignment structure 262 runs through the entire thickness of the first substrate 210, and the second alignment structure 264 runs through the entire thickness of the second substrate 220. That is, the first alignment structure 262 may have a top surface coplanar with the top surface of the first substrate 210 and a bottom surface coplanar with the bottom surface of the first substrate 210, and the second alignment structure 264 is the same. However, the scope of this application is not limited thereto. In some other examples, the first alignment structure 262/second alignment structure 264 may only extend for a part of the thickness of the first substrate 210/second substrate 220.

Referring to FIG. 2B, there are four second alignment structures 264 located at all the quadrangular corner portions of the second substrate 220, respectively. Similarly, there may be four first alignment structures 262 (not shown) located at all the quadrangular corner portions of the first substrate 220, respectively. The first alignment structures 262 and the second alignment structures 264 may each have a circular cross section.

It could be understood that the number, the shape and/or the location of the alignment structure shown in FIG. 2A and FIG. 2B are only for illustrative purpose and not limiting. In some other embodiments, there may be less than four or more than four alignment structures, the alignment structures may have a square cross section, a cross-shaped cross section or other polygonal-shaped cross sections, and the alignment structures may be disposed at a peripheral area of the substrate, such as the outer boundary of the substrates.

As the first alignment structure 262 and the second alignment structure 264 are disposed outside the first interconnection area 215 and the second interconnection area 225 respectively, the first alignment structure 262 and the second alignment structure 264 will not be confused with any of the first interconnection structure 212, the second interconnection structures 222, the connecting elements 230, the external interconnection structures 214, the electronic component 240 and other metal patterns within the interconnection areas in a top view X-ray image. Thus, when the second substrate 220 is stacked or mounted above the first substrate 210, the first alignment structure 262 and the second alignment structure 264 can be used for identification of misalignment between the first substrate 210 and the second substrate 220 with an X-ray inspection tool. Then, the position and/or orientation of the second substrate 220 can be adjusted to accurately align with the first substrate 210.

Figure 3:
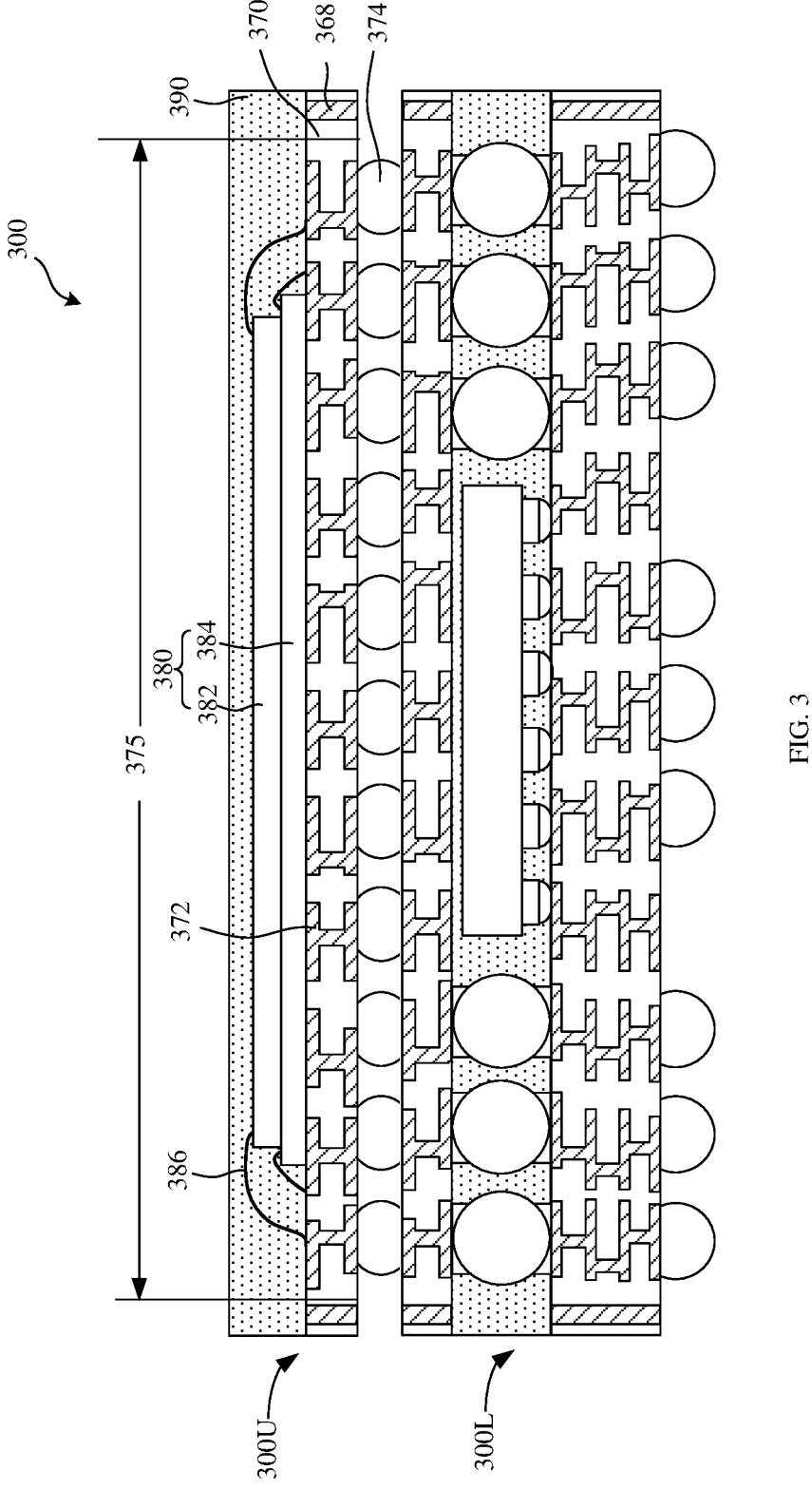
FIG. 3 is a cross-sectional view of an integrated package according to another embodiment of the present application.

Referring now to FIG. 3, an integrated package 300 is illustrated according to an embodiment of the present application. The integrated package 300 includes a lower package 300L and an upper package 300U stacked above the lower package 300L. The lower package 300L is similar to the integrated package 200 shown in FIGS. 2A and 2B, and will not be repeated herein. The upper package 300U includes a third substrate 370, a second electronic component 380 and a second encapsulant 390.

The third substrate 370 may include a third interconnection area 375, and a plurality of third interconnection structures 372 may be formed in the third interconnection area 375. The third interconnection structures 372 can provide connectivity for electrical components mounted on the third substrate 370. The third interconnection area 375 can provide contact pads along the top and bottom surfaces of the third substrate 370 for mounting devices, chips, and interconnects.

The second electronic component 380 is mounted on the top surface of the third substrate 370, and is electrically connected with at least one of the third interconnection structures 372. In the example shown in FIG. 3, the second electronic component 380 includes two stacked semiconductor dice 382 and 384, and are wire-bonded to the third interconnection structures 372 via a set of wires 386. However, it can be understood that the second electronic component 380 may be electrically connected to the third interconnection structures 372 in another fashion, such as by flip chip-bonding. While two semiconductor dice 382 and 384 are illustrated within the upper package 300U, it can be understood that more or less semiconductor devices can be included for other implementations.

The upper package 300U further includes a second encapsulant 390 disposed on the third substrate 370. The second encapsulant 390 can be a molding compound that covers the second electronic component 380. The second encapsulant 390 can provide mechanical protection, environmental protection, and a hermetic seal for the second electronic component 380. The second encapsulant 390 can be made from an epoxy molding compound (EMC), film assisted molding, or polymide compound, as examples.

The upper package 300U further includes a plurality of second conductive bumps 374. The second conductive bumps 374 are disposed on a bottom surface of the third substrate 370, and are configured for electrically connecting at least one of the interconnection structures in the lower package 300L with at least one of the third interconnection structures 372. The second conductive bumps 374 can provide input and output electrical connections for the upper package 300U.

Continuing referring to FIG. 3, a third alignment structure 368 is formed in the third substrate 370 and outside the third interconnection area 375. Similar to the first alignment structure 262 and the second alignment structure 264 in the integrated package 200 shown in FIGS. 2A and 2B, the third alignment structure 368 can be used to accurately identify or detect the alignment between the third substrate 370 and the lower package 300L with an X-ray inspection tool, when or after the third substrate 370 is stacked or mounted above the lower package 300L.

Figure 4:
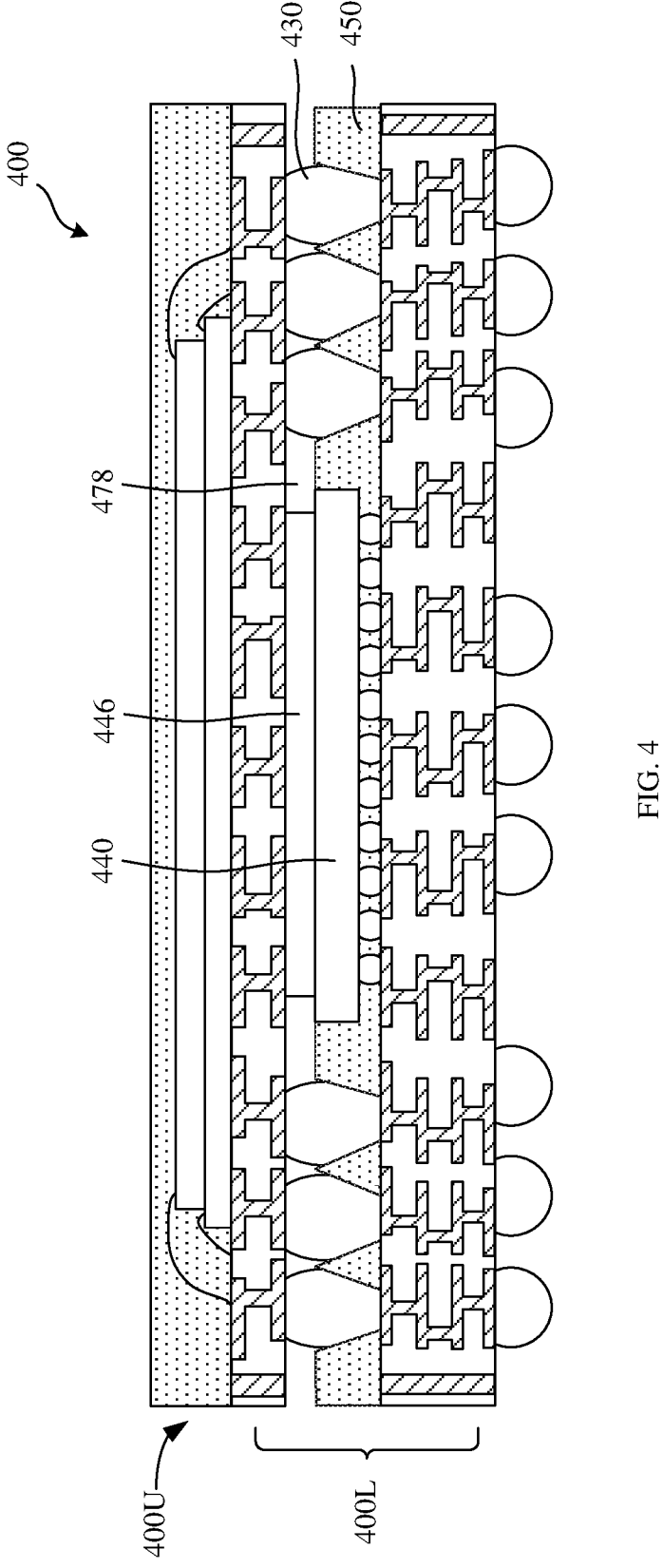
FIG. 4 is a cross-sectional view of an integrated package according to another embodiment of the present application.

Referring now to FIG. 4, an integrated package 400 is illustrated according to an embodiment of the present application. The integrated package 400 includes a lower package 400L and an upper package 400U stacked above the lower package 400L. The upper package 400U has a similar configuration as the second electronic component 380 and the second encapsulant 390 shown in FIG. 3, and will not be repeated herein. The lower package 400L is similar to the integrated package 200 shown in FIGS. 2A and 2B, except that the lower package 400L includes different connecting elements 430, a different first electronic component 440 and a different first encapsulant 450.

As shown in FIG. 4, the first electronic component 440 is mounted on the top surface of the first substrate, and the first encapsulant 450 is also disposed on the top surface of the first substrate. However, the first encapsulant 450 only encapsulates a lateral surface of the first electronic component 440 and a bottom part of the lateral surface of the connecting element 430. That is, the top surface of the first electronic component 440 is exposed from the first encapsulant 450, and the connecting element 430 protrudes from the top surface of the first substrate further than the top surface of the first encapsulant 450. In some embodiments, the connecting element 430 may be a solder ball, and can be formed using a two-step solder ball mounting (SBM) process to obtain a desired height. As the connecting element 430 protrudes from the top surface of the first substrate further than the top surface of the first encapsulant 450, there may be a gap 478 between the second substrate and the first encapsulant 450 or the first electronic component 440. As shown in FIG. 4, an adhesion layer 446 is formed between the second substrate and the first electronic component 440 to improve the adhesion therebetween.

Figure 5:
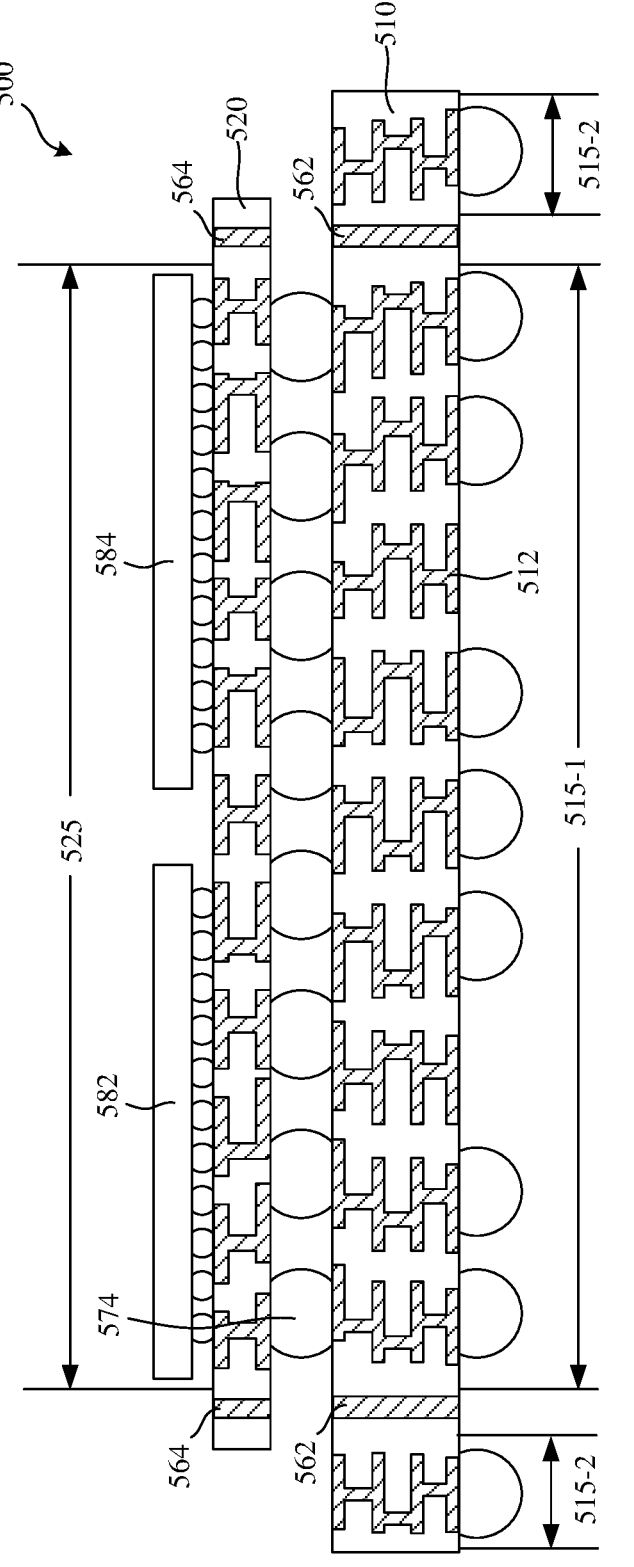
FIG. 5 is a cross-sectional view of an integrated package according to another embodiment of the present application.

Referring now to FIG. 5, an integrated package 500 is illustrated according to an embodiment of the present application. The integrated package 500 is shown as a chiplet, and include a substrate 510, an interposer 520 stacked above the substrate 510, and two electronic components 582 and 584 mounted on the interposer 520. The two electronic components 582 and 584 are shown as small integrated circuit (IC) chips in FIG. 5. However, the present application is not limited thereto. The electronic components mounted on the interposer 520 may also include semiconductor packages, or discrete devices in other embodiments.

The chiplet 500 usually includes small IC chips (such as the IC chips 582 and 584) that contain different well-defined subsets of functionalities, and allow to integrate a variety of different architectures, different process nodes, and even dedicated silicon blocks or intellectual property (IP) blocks from different foundries into a single package. The IC chips 582 and 584 can be mounted on the interposer 520 by flip chip-bonding or other suitable surface mounting techniques.

The substrate 510 and the interposer 520 are similar to the substrate 210 and the interposer 220 shown in FIG. 2A, except that no electrical component is disposed between the substrate and the interposer but the conductive bumps 574, and a size of the interposer 520 is smaller than that of the substrate 510. Consequently, when the interposer 520 is mounted on the substrate 510 via the conductive bumps 574, a peripheral area of the substrate 510 is exposed from the interposer 520. As shown in FIG. 5, the substrate 510 includes a primary interconnection area 151-1 at its center area and a secondary interconnection area 151-2 at the exposed peripheral area, each of which has a plurality of first interconnection structures 512. First alignment structures 562 are formed in the substrate 510 and between the primary interconnection area 151-1 and the secondary interconnection area 151-2. Correspondingly, second alignment structures 564 are formed in the interposer 520 and outside an interconnection area 525 of the interposer 520. Similar to the embodiments described above, the first alignment structures 562 and the second alignment structures 564 can be used to accurately identify or detect the alignment between the substrate 510 and the interposer 520 with an X-ray inspection tool.

It could be understood that the respective number, shape and/or locations of the IC chips and the alignment structures shown in FIG. 5 are only for illustrative purpose, and may vary according to actual needs.

According to another aspect of the present application, a method for making an integrated package is provided. The method can be used to form the integrated package shown in FIGS. 2A and 2B, FIG. 3, FIG. 4 or FIG. 5.

Figure 6:
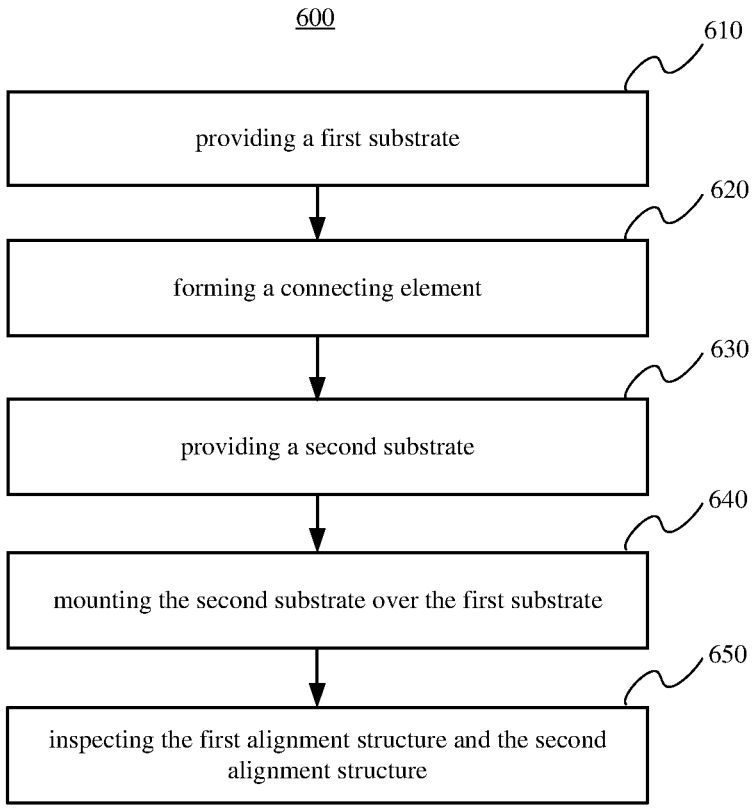
FIG. 6 is a flowchart of a method for making an integrated package according to an embodiment of the present application.

Referring to FIG. 6, a flowchart illustrating a method 600 for making an integrated package is illustrated according to an embodiment of the present application. As illustrated in FIG. 6, the method 600 may start with providing a first substrate in block 610. The first substrate may include a first interconnection area having a plurality of first interconnection structures, and a first alignment structure disposed outside the first interconnection area. In block 620, a connecting element is formed on the first substrate. The connecting element may be electrically connected with at least one of the plurality of first interconnection structures. Then, in block 630, a second substrate is provided. The second substrate may include a second interconnection area having a plurality of second interconnection structures, and a second alignment structure disposed outside the second interconnection area. Afterwards, in block 640, the second substrate is mounted over the first substrate with the connecting element. The connecting element may be electrically connected with at least one of the plurality of second interconnection structures. Afterwards, in block 650, the second alignment structure and the first alignment structure are inspected to determine whether the second substrate is aligned with the first substrate.

In some embodiments, a third substrate may be further provided. The third substrate may include a third interconnection area having a plurality of third interconnection structures, and a third alignment structure disposed outside the third interconnection area. The third substrate can be mounted over the second substrate with a conductive bump. The conductive bump is used to electrically connect at least one of the plurality of second interconnection structures with at least one of the plurality of third interconnection structures. Then, the second alignment structure and the third alignment structure are inspected to determine whether the third substrate is aligned with the second substrate.

In some embodiments, an X-ray inspection tool may be used to inspect the first alignment structure and the second alignment structure, or the second alignment structure and the third alignment structure.

Figure 7A:
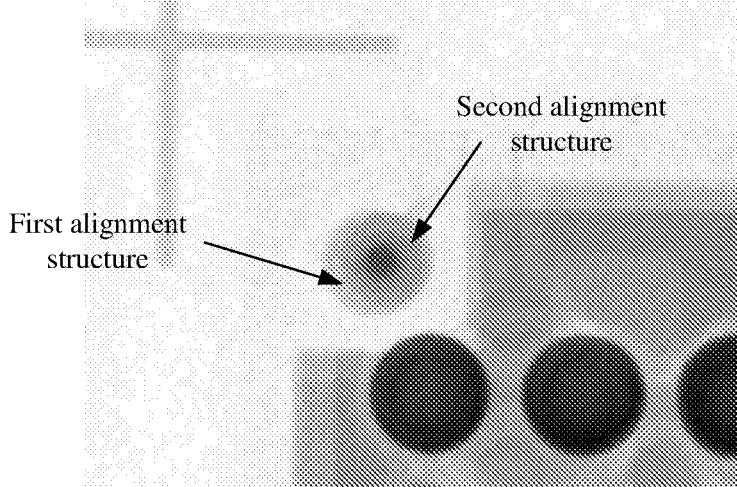
FIG. 7A and FIG. 7B are top view X-ray images of different integrated package.
Figure 7B:
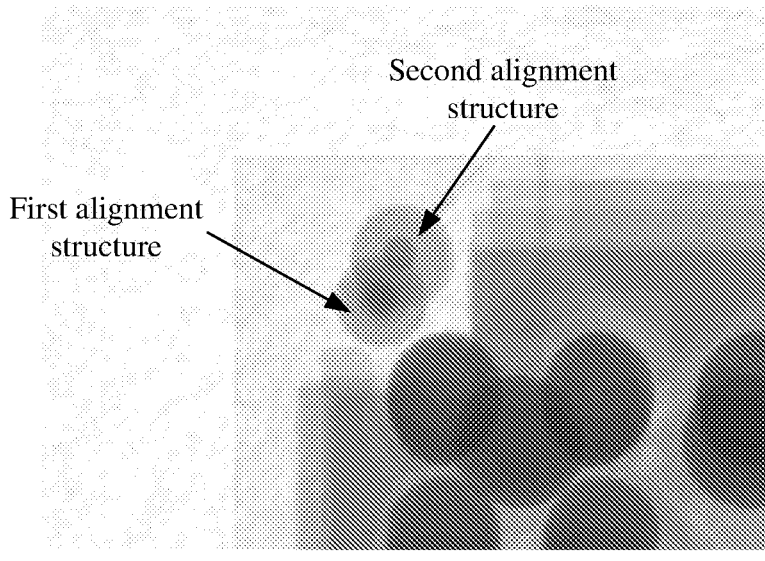

As discussed in above embodiments, the first alignment structure and the second alignment structure will not be confused with interconnection structures and other metal patterns in a top view X-ray image, because both of them are disposed outside the interconnection areas. Thus, when or after the second substrate is mounted above the first substrate, the first alignment structure and the second alignment structure can be used for identification of misalignment between the first substrate and the second substrate with the X-ray inspection tool. For example, when the second alignment structure is aligned with the first alignment structure as shown in FIG. 7A, subsequent processes may be carried out on the integrated package. Otherwise, if the second alignment structure is not well aligned with the first alignment structure as shown in FIG. 7B, the position and/or orientation of the second substrate may be adjusted to accurately align with the first substrate.

While the processes for making the integrated package are illustrated in conjunction with corresponding figures, it will be understood by those skilled in the art that modifications and adaptations to the process may be made without departing from the scope of the present invention.

The discussion herein included numerous illustrative figures that showed various portions of an integrated package and a method of manufacturing thereof. For illustrative clarity, such figures did not show all aspects of each example assembly. Any of the example devices and/or methods provided herein may share any or all characteristics with any or all other devices and/or methods provided herein. It could be understood that, embodiments described in the context of one of the devices or methods are analogously valid for the other devices or methods. Similarly, embodiments described in the context of a device are analogously valid for a method, and vice versa. Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An integrated package, comprising:
   a first substrate comprising:
       a first interconnection area having a plurality of first interconnection structures; and
       a first alignment structure disposed outside the first interconnection area;
   a second substrate stacked above the first substrate and comprising:
       a second interconnection area having a plurality of second interconnection structures; and
       a second alignment structure disposed outside the second interconnection area, wherein the second alignment structure is substantially aligned with the first alignment structure in a stacking direction of the first substrate and the second substrate; and a connecting element disposed between the first substrate and the second substrate and configured for electrically connecting at least one of the plurality of first interconnection structures with at least one of the plurality of second interconnection structures, wherein the first alignment structure and the second alignment structure do not overlap the plurality of first interconnection structures, the plurality of second interconnection structures, and the connecting element in the stacking direction, such that the first alignment structure and the second alignment structure are identifiable in an X-ray image in the stacking direction to determine whether the second substrate is aligned with the first substrate.

2. The integrated package of claim 1, wherein the first alignment structure comprises a material the same as a material of the plurality of first interconnection structures, and the second alignment structure comprises a material the same as a material of the plurality of second interconnection structures.

3. The integrated package of claim 1, wherein the first alignment structure is disposed at a peripheral area of the first substrate, and the second alignment structure is disposed at a peripheral area of the second substrate.

4. The integrated package of claim 1, further comprising:

a first electronic component mounted on a top surface of the first substrate and electrically connected with at least one of the plurality of first interconnection structures;

a first encapsulant disposed between the first substrate and the second substrate and encapsulating the first electronic component and the connecting element; and a first conductive bump disposed on a bottom surface of the first substrate and electrically connected with at least one of the plurality of first interconnection structures.

5. The integrated package of claim 4, wherein the connecting element comprises:

a bottom conductive joint electrically connected with at least one of the plurality of first interconnection structures;

a top conductive joint electrically connected with at least one of the plurality of second interconnection structures; and a conductive ball disposed between the bottom conductive joint and the top conductive joint.

6. The integrated package of claim 5, further comprising:

a third substrate stacked above the second substrate and comprising:

a third interconnection area having a plurality of third interconnection structures; and a third alignment structure disposed outside the third interconnection area, wherein the third alignment structure is substantially aligned with the second alignment structure in a stacking direction of the second substrate and the third substrate.

7. The integrated package of claim 6, further comprising:

a second electronic component mounted on a top surface of the third substrate and electrically connected with at least one of the plurality of third interconnection structures;

a second encapsulant disposed on the third substrate and encapsulating the second electronic component; and a second conductive bump disposed on a bottom surface of the third substrate and configured for electrically connecting at least one of the plurality of second interconnection structures with at least one of the plurality of third interconnection structures.

8. The integrated package of claim 1, further comprising:

a first electronic component mounted on a top surface of the first substrate and electrically connected with at least one of the plurality of first interconnection structures;

a first encapsulant disposed on the top surface of the first substrate and encapsulating at least lateral surfaces of the first electronic component and the connecting element; and a first conductive bump disposed on a bottom surface of the first substrate and electrically connected with at least one of the plurality of first interconnection structures.

9. The integrated package of claim 8, wherein the connecting element comprises a solder ball, and the solder ball protrudes from the top surface of the first substrate further than a top surface of the first encapsulant.

10. The integrated package of claim 9, further comprising:

a second electronic component mounted on a top surface of the second substrate and electrically connected with at least one of the plurality of second interconnection structures; and a second encapsulant disposed on the second substrate and encapsulating the second electronic component.

11. The integrated package of claim 1, further comprising:

one or more integrated circuit (IC) chips mounted on a top surface of the second substrate and electrically connected with at least one of the plurality of second interconnection structures.

12. A method for making an integrated package, comprising:

providing a first substrate, wherein the first substrate comprises a first interconnection area having a plurality of first interconnection structures, and a first alignment structure disposed outside the first interconnection area;

forming a connecting element on the first substrate, wherein the connecting element is electrically connected with at least one of the plurality of first interconnection structures;

providing a second substrate, wherein the second substrate comprises a second interconnection area having a plurality of second interconnection structures, and a second alignment structure disposed outside the second interconnection area;

mounting the second substrate over the first substrate with the connecting element, wherein the connecting element is electrically connected with at least one of the plurality of second interconnection structures; and inspecting the first alignment structure and the second alignment structure using an X-ray inspection tool to determine whether the second substrate is aligned with the first substrate, wherein the first alignment structure and the second alignment structure do not overlap the plurality of first interconnection structures, the plurality of second interconnection structures, and the connecting element in a stacking direction of the first substrate and the second substrate, such that the first alignment structure and the second alignment structure are identifiable in an X-ray image of the X-ray inspection tool in the stacking direction.

13. The method of claim 12, further comprising:

providing a third substrate, wherein the third substrate comprises a third interconnection area having a plurality of third interconnection structures, and a third alignment structure disposed outside the third interconnection area;

mounting the third substrate over the second substrate with a conductive bump, wherein the conductive bump electrically connects at least one of the plurality of second interconnection structures with at least one of the plurality of third interconnection structures; and inspecting the second alignment structure and the third alignment structure to determine whether the third substrate is aligned with the second substrate.

\* \* \* \* \*